(12) United States Patent
Chen et al.

(10) Patent No.: US 7,054,196 B2
(45) Date of Patent: May 30, 2006

(54) METHOD FOR PROGRAMMING P-CHANNEL EEPROM

(75) Inventors: Chien-Hung Chen, Sanchong (TW); Shui-Chin Huang, Tainan (TW)

(73) Assignee: United Microelectronics Corp., Hisnchu (TW)

( * ) Notice: Subject to any disclaimer, the term of this patent is extended or adjusted under 35 U.S.C. 154(b) by 201 days.

(21) Appl. No.: 10/728,137

(22) Filed: Dec. 3, 2003

(65) Prior Publication Data

US 2005/0116262 A1 Jun. 2, 2005

(30) Foreign Application Priority Data

Nov. 28, 2003 (TW) .............................. 92133507 A

(51) Int. Cl.
*G11C 16/04* (2006.01)

(52) U.S. Cl. ........................... 365/185.18; 365/185.01; 365/185.26; 365/226

(58) Field of Classification Search ........... 365/185.18, 365/185.26, 185.01, 226
See application file for complete search history.

(56) References Cited

U.S. PATENT DOCUMENTS 5,491,657 A * 2/1996 Haddad et al. ........ 365/185.27

* cited by examiner

*Primary Examiner*—Richard Elms
*Assistant Examiner*—Pho M. Luu
(74) *Attorney, Agent, or Firm*—J.C. Patents

(57) ABSTRACT

A method for programming a P-channel EEPROM having an N-well, a floating gate, a control gate, a P-type source region and a P-type drain region is provided. In the method, the N-well is grounded, a first positive voltage is applied to the control gate, a second positive voltage or a programming current is applied to the P-type source region, and a negative voltage is applied to the P-type drain region.

9 Claims, 2 Drawing Sheets

METHOD FOR PROGRAMMING P-CHANNEL EEPROM

CROSS-REFERENCE TO RELATED APPLICATION

This application claims the priority benefit of Taiwan application serial no. 92133507, filed Nov. 28, 2003.

BACKGROUND OF THE INVENTION

1. Field of the Invention

The present invention relates to a method for operating a semiconductor device. More particularly, the present invention relates to a method for programming a P-channel electrical erasable programmable read-only memory (EEPROM).

2. Description of the Related Art

Electrical erasable programmable read-only memory (EEPROM) is a type of non-volatile memory with many advantages including a rapid response, a large storage capacity and a small size. Hence, EEPROM has become one of the most frequently used portable memory devices. Earlier EEPROM was constructed of N-type transistors and programmed with channel hot electron injection (CHEI). However, the CHEI programming method has low electron injection efficiency. Hence, newer EEPROM is constructed of P-channel transistors and programmed with band-to-band tunneling hot electron injection (BTBTHEI). The BTBTHEI method has an electron injection efficiency roughly two magnitudes higher than that of the CHEI method, and hence makes a much higher programming speed.

FIG. 1 is a schematic cross-sectional view of a P-channel EEPROM undergoing a programming operation using a conventional BTBTHEI method. The P-channel EEPROM comprises an N-well 100, a floating gate 110, a control gate 120, a select gate 130, a P-type source region 140, a P-type drain region 150 and a P-doped region 160 coupled to a bit line (not shown). To program the P-channel EEPROM, a negative voltage $V_d$ is applied to the bit line/P-doped region 160, and another negative voltage $V_{sg}$ is applied to the select gate 130 to turn on the channel below so that the negative voltage is passed to the drain region 150. In the meantime, a high positive voltage $V_{cg}$ is applied to the control gate 120 to induce band-to-band tunneling hot electrons near the floating gate 110 close to the drain region 150, and a part of the hot electrons are attracted into the floating gate 110. Furthermore, the source region 140 is floated in the conventional BTBTHEI method.

However, both the CHEI programming method for N-channel EEPROM and the BTBTHEI programming method for P-channel EEPROM need relatively high operation voltages. FIG. 3 is a graph showing the variation of threshold voltage of a memory cell with time at different bit line voltage $V_d$ using the conventional BTBTHEI method for programming a P-channel EEPROM. As shown in FIG. 3, the control gate voltage $V_{cg}$ is set to a constant voltage of 7V. To generate sufficient band-to-band tunneling hot electrons so that programming can be completed within a designated period, a negative voltage $V_d$ up to −7V, rather than −5V or −3V, must be applied to the bit line. With the application of such a high negative voltage, reducing the channel length of the select gate 130 is unfeasible due to the possibility of an increase in punch-through leakage.

Furthermore, to increase the amount of hot electrons and the percentage of injected hot electrons for speeding up the programming operation, usually a negative voltage $V_{sg}$ up to −8V to −9V is applied to the select gate 130, and a positive voltage $V_{cg}$ up to 8V to 9V is applied to the control gate 120. Hence, the overall power consumption during a memory programming operation is relatively high in the prior art.

SUMMARY OF THE INVENTION

Accordingly, at least one object of the present invention is to provide a method for programming a P-channel electrical erasable programmable read-only memory (EEPROM). The method utilizes the snapback effect of a parasitic bipolar junction transistor (BJT) constituted of the source, the drain and the N-well to produce a large amount of hot electrons, so as to increase the efficiency of band-to-band tunneling hot electron injection (BTBTHEI).

To achieve these and other advantages and in accordance with the purpose of the invention, as embodied and broadly described herein, the invention provides a P-channel EEPROM programming method. Instead of floating the source region, the method applies a positive voltage or a programming current to the source region. The forward bias such created is large enough to turn on a parasitic bipolar junction transistor (BJT) constituted of the source region, the drain region and the N-well. In addition, the N-well is grounded, a positive voltage is applied to the control gate and a negative voltage is applied to the drain region. The reverse bias resulting from the negative voltage generates a large electron current between the source region and the drain region, and some electrons are injected into the floating gate.

By utilizing the snapback effect of the parasitic bipolar junction transistor inside the EEPROM, a large amount of hot electroris are produced. Therefore, the voltage applied to the bit line, the select gate and the control gate of an EEPROM cell can be lowered to save electrical power. Furthermore, with reduction of the bit line voltage, the length of channel underneath the select gate can be reduced to increase the read-out current and facilitate the miniaturization of a dual transistor (2T) device. In addition, the degree of programming can be controlled by adjusting the magnitude of the programming source current. Because the magnitude of a current is easier to control, this invention is particularly suitable for programming a multi-level cell (MLC).

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
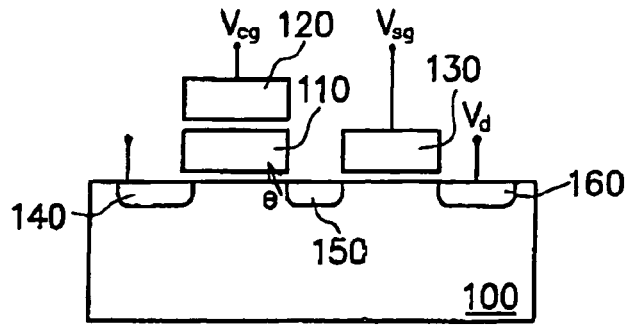
FIG. 1 is a schematic cross-sectional view of a P-channel EEPROM undergoing a programming operation using a conventional BTBTHEI method.

Reference will now be made in detail to the present preferred embodiments of the invention, examples of which are illustrated in the accompanying drawings. Wherever possible, the same reference numbers are used in the drawings and the description to refer to the same or like parts.

Figure 2:
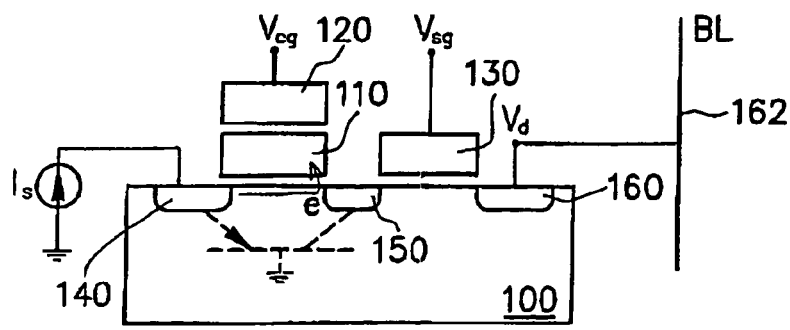
FIG. 2 is a schematic cross-sectional view of a P-channel EEPROM undergoing a programming operation utilizing the snapback effect of a parasitic bipolar junction transistor according to this invention.
Figure 3:
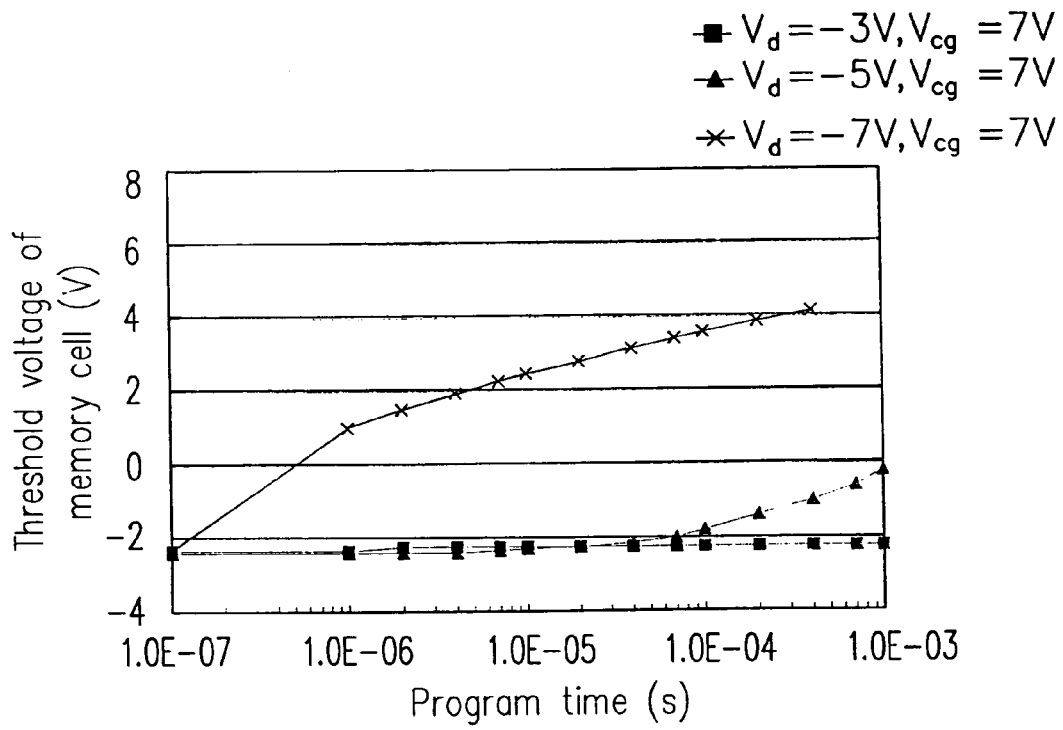
FIG. 3 is a graph showing the variation of threshold voltage of a memory cell with time at different bit line voltage $V_d$ but a fixed $V_{cg}$ of 7V using the conventional BTBTHEI method for programming a P-channel EEPROM.

FIG. 2 is a schematic cross-sectional view of a P-channel EEPROM undergoing a programming operation utilizing the snapback effect of a parasitic bipolar junction transistor according to this invention. As shown in FIG. 2, the P-channel EEPROM comprises an N-well 100, a floating gate 110, a control gate 120, a select gate 130, a P-type source region 140, a P-type drain region 150 and a P-doped region 160 coupled to a bit line (BL) 162. In the programming operation, a positive voltage $V_{cg}$ of, for example, 5V–6V is applied to the control gate 120, the N-well 100 is grounded (that is, the voltage $V_b$ of the N-well is 0V), and a positive voltage or a programming current $I_s$ is applied to the source region 140. The programming current $I_s$ can be set to several nA to several μA, for example, depending on the application. It is noted that the programming current $I_s$ can be adjusted to reach a balance point between power consumption and programming speed. In general, increasing the programming current $I_s$ increases the programming speed, but adversely increases the power consumption. Conversely, although decreasing the programming current $I_s$ decreases the programming speed, the overall-power consumption can be reduced.

The forward bias produced by applying the positive voltage or the programming current $I_s$ to the source region 140 is large enough to turn on the parasitic bipolar junction transistor (BJT) constituted of the source region 140, the drain region 150 and the N-well 100. The source region 140, the N-well 100 and the drain region 150 serve as an emitter, a base and a collector, respectively. In addition, a negative voltage $V_d$ of, for example, −3V––5V is applied to the bit line/P-doped region 160, and a negative voltage $V_{sg}$ of, for example, −4V––6V is applied to the select gate 130 to switch on the channel underneath the select gate 130 and thereby pass the negative voltage of the P-doped region 160 to the drain region 150. The reverse bias caused by the negative voltage is large enough to produce a large electron current between the source region 140 and the drain region 150. These electrons are accelerated by the high electric field at the junction depletion region of the drain region 150 to produce hot electrons. Through the attraction of the high positive voltage $V_{cg}$ applied to the control gate 120, a portion of the hot electrons is injected into the floating gate 110.

With the aforementioned voltage configuration, the programming period is set at the order of ten microseconds. Table 1 below lists all the programming conditions for the conventional BTBTHEI programming method as well as the aforementioned programming method of this invention.

Figure 4:
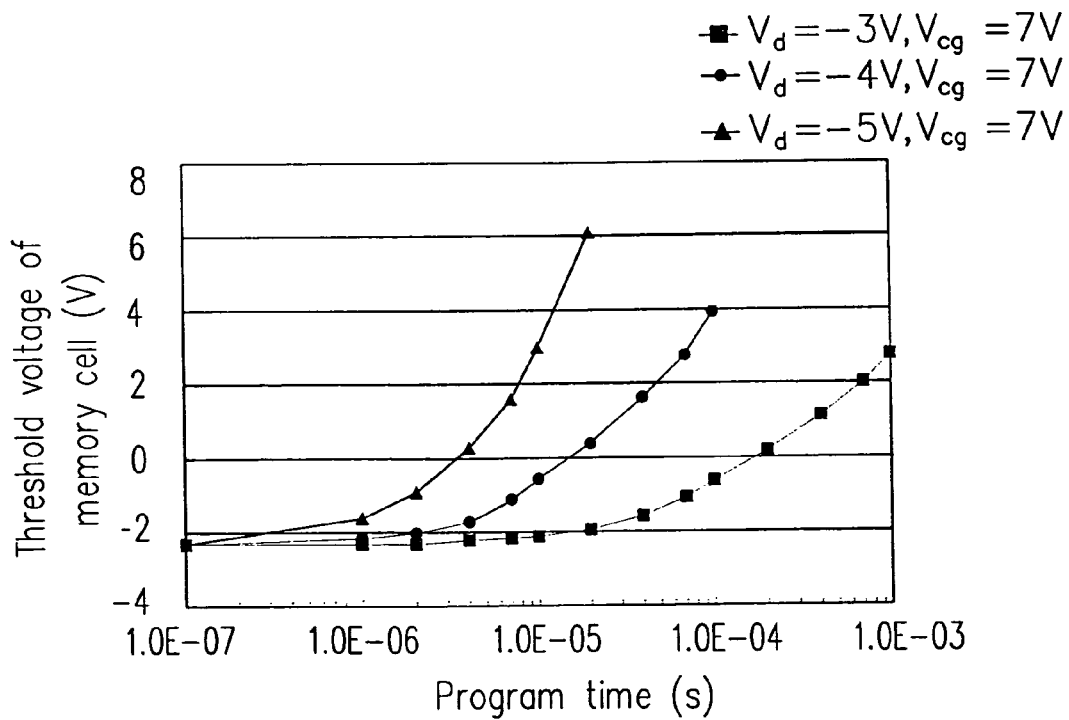
FIG. 4 is a graph showing the variation of threshold voltage of a memory cell with time at different bit line voltage $V_d$ but a fixed $V_{cg}$ of 7V using the method for programming a P-channel EEPROM according to this invention.

FIG. 4 is a graph showing the variation of threshold voltage of a memory cell with time at different bit line voltage $V_d$ using the method of programming a P-channel EEPROM according to this invention. A fixed voltage $V_{cg}$ of 7V is used. As shown in FIG. 4, the effect of setting the voltage $V_d$ to −3V already exceeds the effect of setting the voltage $V_d$ to −5V in the conventional programming method. When $V_d$ is set to −5V, the effect is similar to that of setting the voltage $V_d$ to −7V in the conventional programming method. In other words, using the programming method of this invention permits the employment of lower bit line voltage $V_d$.

In addition, when the programming period is fixed, increasing (or decreasing) the source current $I_s$ can increase (or decrease) the amount of hot electrons injected into the floating gate, and thereby increase (or decrease) the degree of the raise of the threshold voltage of the channel. In general, the source current $I_s$ is easier to control than the bit line voltage $V_d$. Hence, when an adjusting mechanism capable of varying the source current $I_s$ is setup, the programming method of this invention can be used to program a multi-level cell (MLC) to a specific threshold voltage level.

Because this invention utilizes the snapback effect of the parasitic bipolar junction transistor inside the EEPROM, a large amount of hot electrons are produced. Therefore, the voltages applied to the bit line, the select gate and the control gate of an EEPROM cell can be lowered to save electrical power. Furthermore, with a reduction of the bit line voltage, the length of channel underneath the select gate can be reduced to increase the read-out current and facilitate the miniaturization of a dual transistor (2T) device. In addition, the degree of programming can be controlled by adjusting the magnitude of the programming source current. Because the magnitude of a current is easier to control, this invention is particularly suitable for programming a multi-level cell (MLC).

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for programming a P-channel electrical erasable programmable read-only memory (EEPROM) having an N-well, a floating gate, a control gate, a P-type source region, a P-type drain region and a select transistor coupling the drain region to a bit line, the method comprising the steps of:

grounding the N-well;

applying a first positive voltage to the control gate;

TABLE 1

| | $V_d$ | Source ($V_s$) | $V_{cg}$ | $V_{sg}$ | $V_b$ | Programming period | Factor affecting programming speed |
|---|---|---|---|---|---|---|---|
| Conventional | −6 V––7 V | Floated | 8 V–9 V | −8 V––9 V | 0 | ~10 μs | $V_d$ |
| This invention | −3 V––5 V | Forward biased | 5 V–6 V | −4 V––6 V | 0 | ~10 μs | $I_s$ | applying a second positive voltage or a programming current to the source region; and applying a first negative voltage to the bit line and switching on the select transistor, so that the first negative voltage is passed to the drain region, wherein the second positive voltage or the programming current leads to a forward bias capable of turning on a parasitic bipolar transistor that includes the source region, the drain region and the N-well, and a reverse bias between the drain region and the N-well is capable of generating an electron current between the source region and the drain region for injection into the floating gate.

2. The method of claim 1, wherein the first positive voltage is 5V–6V.

3. The method of claim 1, wherein the first negative voltage is −3V−−5V.

4. The method of claim 1, wherein a second negative voltage of about −4V−−6V is applied to a gate electrode of the select transistor.

5. The method of claim 1, wherein the P-channel EEPROM is a multi-level memory cell, and the programming current is adjustable so that the multi-level memory cell can be programmed to a specific threshold voltage level.

6. A method for programming a P-channel electrical erasable programmable read-only memory (EEPROM) having an N-well, a floating gate, a control gate, a P-type source region and a P-type drain region, the method comprising the steps of:

grounding the N-well;

applying a first positive voltage to the control gate;

applying a second positive voltage or a programming current to the source region; and applying a first negative voltage to the drain region, wherein the second positive voltage or the programming current leads to a forward bias capable of turning on a parasitic bipolar transistor that includes the source region, the drain region and the N-well, and a reverse bias between the drain region and the N-well is capable of generating an electron current between the source region and the drain region for injection into the floating gate.

7. The method of claim 6, wherein the first positive voltage is 5V–6V.

8. The method of claim 6, wherein the first negative voltage is −3V−−5V.

9. The method of claim 6, wherein the P-channel EEPROM is a multi-level memory cell, and the programming current is adjustable so that the multi-level memory cell can be programmed to a specific threshold voltage level.

* * * * *